United States Patent [19]

Stall et al.

[11] 4,398,963
[45] Aug. 16, 1983

[54] METHOD FOR MAKING NON-ALLOYED HETEROJUNCTION OHMIC CONTACTS

[75] Inventors: Richard A. Stall, Summit, N.J.; Colin E. C. Wood, Freeville; Lester F. Eastman, Ithaca, both of N.Y.

[73] Assignee: The United States of America as represented by the Secretary of the Navy, Washington, D.C.

[21] Appl. No.: 208,596

[22] Filed: Nov. 19, 1980

[51] Int. Cl.³ .................. H01L 21/265; H01L 29/261; H01L 23/48; H01L 7/54
[52] U.S. Cl. .................................. 148/1.5; 29/576 B; 29/590; 148/175; 148/187; 357/65; 357/91
[58] Field of Search ........................ 148/1.5, 175, 187; 29/576 B, 590; 357/65, 91

[56] References Cited

U.S. PATENT DOCUMENTS

| | | | |
|---|---|---|---|
| 4,213,801 | 9/1980 | Johnston, Jr. | 148/1.5 |
| 4,218,271 | 8/1980 | Wood | 148/175 |
| 4,233,092 | 11/1980 | Harris et al. | 148/1.5 |
| 4,298,403 | 11/1981 | Davey et al. | 148/1.5 |
| 4,330,343 | 5/1982 | Christou et al. | 148/1.5 |
| 4,335,362 | 6/1982 | Salathe et al. | 357/65 |

OTHER PUBLICATIONS

Jaros et al., Solid St. Electronics, 18, (1975), 1029.
Barnes et al., Appl. Phys. Letts., 33, (1978), 965.

*Primary Examiner*—Upendra Roy
*Attorney, Agent, or Firm*—Robert F. Beers; Arthur A. McGill; Prithvi C. Lall

[57] ABSTRACT

Ultra low resistance heterojunction ohmic contacts to semiconductors such as gallium arsenide (GaAs) is described wherein a single crystal layer of germanium degenerately doped with arsenic is deposited on gallium arsenide using molecular-beam epitaxy (MBE). A metallic film is then deposited over the single crystal layer of heavily doped germanium so as to obtain a non-alloyed heterojunction ohmic contact having a very low specific resistance.

5 Claims, 2 Drawing Figures

METHOD FOR MAKING NON-ALLOYED HETEROJUNCTION OHMIC CONTACTS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

This invention is related to semiconductors and, more particularly, to an ultra low resistance ohmic contact to the semiconductors such as gallium arsenide.

(2) Description of the Prior Art

In order to form low resistance ohmic contacts to semiconductors that have surface states (extrinsic or intrinsic) which pin the Fermi level inside the forbidden zone of the semiconductor, it is usually necessary to alloy complex metallurgical layers. Such a process is time consuming, expensive and is not completely reliable. Furthermore, it does not provide contacts which are resistant to degradation under high temperature operations. Furthermore, it is usually difficult to control the morphology of the alloy. Therefore, it is desirable to have a low resistance ohmic contact for semiconductors which can be made without melting a eutectic mixture of a metal such as gold, with germanium (which acts as an impurity) on a semiconductor such as GaAs.

SUMMARY OF THE INVENTION

The method of fabricating ultra low resistance non-alloyed ohmic contact to semiconductors according to the teachings of the subject invention involves depositing a uniform layer of GaAs on a substrate of GaAs. A single crystal layer of germanium (Ge) is degenerately doped with arsenic ($\eta \geq 10^{20}$ cm$^{-3}$) on a uniform gallium arsenide layer using molecular-beam epitaxy (MBE). A metallic film is then deposited over the gallium arsenide layer having a single crystal layer of heavily degenerated germanium with arsenic thereon. The structure thus obtained acts as an ohmic contact of a very low resistance for gallium arsenide.

An object of the subject invention is to prepare a low resistance non-alloyed ohmic contact for semiconductors.

Another object of the subject invention is to obtain an ultra low resistance heterojunction ohmic contact for semiconductors which does not require melting of a eutectic mixture of a metal and an impurity to be incorporated in the semiconductor.

Still another object of the subject invention is to have a simple method of preparing an ultra low resistance ohmic contact for semiconductors.

Still another object of the subject invention is to obtain a low resistance ohmic contact which is reliable and does not degenerate at higher temperatures.

Other objects, advantages and novel features of the invention will become apparent from the following detailed description of the invention when considered in conjunction with the accompanying drawing wherein:

DESCRIPTION OF THE PREFERRED EMBODIMENT

Figure 1:
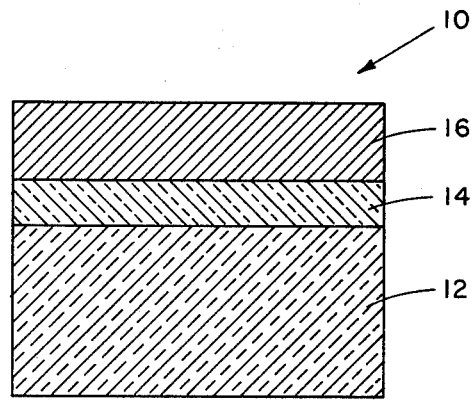
FIG. 1 is a cross sectional view of a non-alloyed heterojunction homic contact according to the teachings of subject invention.

An ultra low resistance ohmic contact according to the teachings of the subject invention is shown in FIG. 1 designated as 10. The ohmic contact 10 includes a uniform layer 12 of gallium arsenide (GaAs). The thickness of layer 12 is preferably over 0.1 micron (1 micron, $\mu = 10^{-6}$ meter). A single crystal layer 14 of germanium (Ge) degeneratly doped with arsenic ($\eta \geq 10^{20}$ cm$^{-3}$) is deposited on layer 12. The thickness of single crystal layer 14 is preferably 250 Å (1 Å = $10^{-10}$ meter). A metal deposit 16 is evaporated on single crystal layer 14 as shown in FIG. 1. The metal used is preferably a refractory metal such as molybdenum, titanium, tungsten, nickel or the like, although gold or other suitable metals can be used. The thickness of the metallic layer is approximately 2,000 Å. In particular, 1 micrometer thick selenium-doped ($\eta$ = approximately $1 \times 10^{18}$ cm$^{-8}$) gallium arsenide layers were first grown on chromium-doped (semiinsulating) gallium arsenide (GaAs) substrates at approximately 550° C. using a PbSe molecular dopant source. An epitaxial germanium (Ge) layer preferably of thickness of 250 Å was grown by using molecular-beam epitaxy (MBE) in a residual background arsenic pressure (approximately $2 \times 10^{-8}$ Torr = $2 \times 10^{-8}$ m.m of Hg). The doping level was measured by the Hall effect to be $1.4 \times 10^{20}$ cm$^{-3}$ with a mobility of approximately 80 cm$^2$ V$^{-1}$ s$^{-1}$ for growth at 280° C. This value was considered to be the highest electron concentration reported to data in the literature for n-Ge. The Ge layer was shown to be single crystal by the (2×2) reconstructed pattern observed by 10 keV in situ reflection electron diffraction (r.e.d.).

As is commonly known in the prior art, the method of deposition using molecular beam epitaxy (MBE) includes using materials such as Ge in one container and arsenic in the other container and the two materials are separately evaporated and injected into the common area where the substrate (e.g., gallium arsenide) is located. It should be noted that Ge is used for depositing a single crystal layer of Ge degenerately doped ($\eta \geq 10^{20}$ cm$^{-3}$) with arsenic in order to have lattice matching so as to form a single crystal layer of Ge on gallium-arsenide. However, it should be noted that materials other than Ge can also be used without deviating from the teachings of the subject invention. It should further be noted that an ordinary evaporator can also be used to deposit a single layer of Ge degenerately doped with arsenic. This is accomplished by first depositing Ge at a pressure of preferably $10^{-7}$ Torr and that of arsenic is $10^{-9}$ Torr. The time taken for growing the single crystal layers of Ge varied from 15 minutes to 30 minutes. After removal from the growth chamber a gold layer of thickness approximately 2,000 Å was deposited by evaporation. To minimize fringing fields, 2 $\mu$m deep moat was ion milled around the contact sets using thick photoresist.

Figure 2:
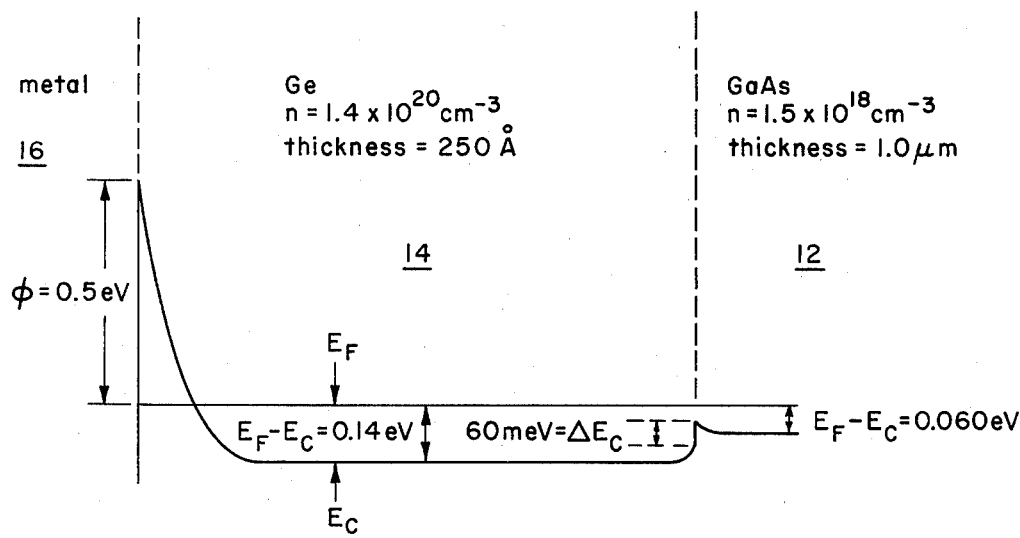
FIG. 2 is a graphical representation of the energy levels in different layers of an ohmic contact including a metallic layer deposited on single crystal layer of germanium, degenerately dped with arsenic, over a substrate of gallium arsenide (GaAs).

FIG. 2 is an energy level diagram which indicates the energy levels in the various semiconductor and metallic films as a function of the distance. As shown in FIG. 2, Fermi level, $E_f$ is at the same position for the metal (Au), Ge and gallium arsenide layers when no bias is applied (i.e. under equilibrium conditions). When a negative bias is applied to the metallic layer 16, the Fermi level in layer 16 is raised because of the biasing with the result that some of the electrons in the metallic layer 16 are available in the metal to tunnel through the depleted part of the germanium film or layer 14. It should be further noted that as a result of the negative bias on the metal contact, the electrons from the metal tunnel through the metal barrier. Because of low barrier height of metals to germanium for electrons and high value of donar density available in germanium, the tunneling specific contact resistance $\rho c$, defined as reciprocal of change in current density to change in voltage $[(dJ/dV)^{-1}]$ and measured as ohm -cm$^2$, is low.

It should be noted that the specific resistance, $\rho c$ using this technique has been calculated theoretically to be less than $10^{-8}$ ohm -cm$^2$. In a device built according to this technique, a value of specific resistance of approximately $5 \times 10^{-8}$ ohm -cm$^2$ was obtained as opposed to a value of $2 \times 10^{-6}$ ohm -cm$^2$ using a non-alloyed technique by J. V. DiLorenzo et al, Murray Hill Lab.

Briefly stated, the technique of fabricating an ultra low resistance non-alloyed heterojunction ohmic contact according to the teachings of subject invention involves depositing a uniform film of GaAs preferably of thickness equal to or greater than 0.1 micron and having an electron density of greater than $1.0 \times 10^{18}$ cm$^{-3}$ on a GaAs substrate. A single layer of Ge degenerately doped ($\eta \geq 10^{20}$ cm$^{-3}$) with arsenic deposited on gallium arsenide (GaAs) and having an electron density greater than $1.0 \times 10^{18}$ cm$^{-3}$. A metallic film is then evaporated on the single crystal layer of Ge. The structure thus obtained provides an ultra low resistance non-alloyed ohmic contact for a semiconductor.

Obviously, many modifications and variations of the present invention are possible in the light of the above teachings. As an example, a single crystal layer of any semiconductor material with a low forbidden band gap other than germanium, degenerately doped with any $\eta$-type dopant can be used. Such a material as indium arsenide (InAs) is an example. The main advantage of using Ge degenerately doped with arsenic is that it has almost perfect lattice matching with gallium arsenide (GaAs). Besides, the thickness of various layers can vary from the teachings of subject invention. Furthermore, the metal deposited on the Ge single crystal layer can be either an amorphorous film thereof or it can be in the form of a crystal. Furthermore, metals other than gold (Au) can also be used without deviating from the teachings of the subject invention. Besides, a single crystal layer of Ge degenerately doped with arsenic can be deposited on gallium arsenide substrate by using a method other than molecular beam epitaxy (MBE). As an example, a simple evaporator with the provisions of obtaining optimum pressure can also be used. It is, therefore, to be understood that within the scope of the appended claims the invention may be practiced otherwise than as specifically described.

What is claimed is:

1. A method of making a non-alloyed low resistance phmic contact having specific contact resistance less than $10^{-7}$ ohm-cm$^2$ and including a substrate of a semiconductor, a degenerately doped single crystal layer of a material having matching lattice structure to that of said semiconductor and a metallic layer which includes the steps of:

growing the substrate of said semiconductor;

depositing a single crystal layer of degenerately doped material having a doping density exceeding $10^{20}$ cm$^{-3}$ over the substrate of said semiconductor; and evaporating the metallic layer over the single crystal layer of said degenerately doped material.

2. The method of claim 1 wherein the step of depositing the single crystal layer of the degenerately doped material includes depositing a single crystal layer of Ge thickness 250 Å over said substrate using molecular beam epitaxy (MBE).

3. The method of claim 2 wherein the step of depositing the single crystal layer of the degenerately doped Ge includes creating doping density of at least $10^{20}$ cm$^{-3}$ in said single crystal layer using an ion implantation technique.

4. The method of claim 1 wherein the step of depositing the single crystal layer of the degenerately doped material includes the step of evaporating As for making single crystal layer of Ge as degenerately doped material in an evaporator.

5. The method of claim 2 which further includes depositing a gold layer of thickness 2000 Å over the degenerately doped layer of Ge of thickness 250 Å.

* * * * *